United States Patent [19]
Dearden et al.

[11] 3,976,948
[45] Aug. 24, 1976

[54] PULSE-FREQUENCY SENSITIVE SWITCHING CIRCUIT ARRANGEMENT

[75] Inventors: Brian Dearden, Rochdale; Geoffrey Shepherd, Oldham, both of England

[73] Assignee: Ferranti Limited, Hollinwood, England

[22] Filed: Jan. 3, 1975

[21] Appl. No.: 538,269

[30] Foreign Application Priority Data
Jan. 5, 1974  United Kingdom............... 522/74

[52] U.S. Cl................................ 328/138; 328/140; 307/247 R
[51] Int. Cl.²........................................ H03B 3/04
[58] Field of Search.......................... 328/138, 140; 307/247 R

[56] References Cited
UNITED STATES PATENTS

| | | | |
|---|---|---|---|
| 3,413,490 | 11/1968 | Breunig et al. | 328/140 X |
| 3,466,550 | 9/1969 | Wolf et al. | 328/140 |
| 3,474,341 | 10/1969 | Crafts et al. | 328/140 X |
| 3,521,174 | 7/1970 | Naubereit et al. | 328/138 |
| 3,763,435 | 10/1973 | Holman | 328/138 X |
| 3,882,545 | 5/1975 | Titus | 328/140 X |

*Primary Examiner*—John S. Heyman
*Attorney, Agent, or Firm*—Cameron, Kerkam, Sutton, Stowell & Stowell

[57] ABSTRACT

A frequency sensitive switching arrangement is arranged to cause a bistable switching arrangement to produce an output signal at a first or second level depending whether the pulse rate is below a lower rate or above a higher rate with hysteresis preventing change of level between the rates. The bistable switch is arranged to give an output signal at a first or second level in dependence on whether an input pulse is applied to a first or second input. A first monostable element having a first preset unstable period opens a gate to permit pulses to be applied to the second input for the first unstable period and a second monostable element having a second preset unstable period, longer than the first, closes a gate to prevent pulses from being applied to the first input terminal for the second unstable period. Any input pulses occurring between the end of first and second periods is not applied to either terminal and the output level remains as previously. A reset arrangement may be provided to return the output to the low pulse rate state in the event of a sudden cessation of input pulses.

5 Claims, 3 Drawing Figures

PULSE-FREQUENCY SENSITIVE SWITCHING CIRCUIT ARRANGEMENT

This invention relates to pulse-frequency sensitive switching circuit arrangements and in particular to such circuit arrangements displaying a hysteresis between switching frequencies.

It is an object of the present invention to provide a pulse-frequency sensitive switching arrangement of simple construction.

According to the present invention a frequency sensitive switching circuit arrangement comprises a circuit input terminal arranged to receive input pulses from a pulse train, a bistable switching arrangement having first and second input terminals and responsive to the application of an input pulse, by way of the circuit input terminal, to either one of said first or second input terminals to provide an output signal having a first or second level respectively, switching means responsive to a time interval between successive input pulses of less than a first preset period to apply said pulses to the first input terminal, and second switching means responsive to a time interval between successive input pulses in excess of a second preset period, longer than the first, to apply said pulses to the second input terminal, the first and second switching means being responsive to a time interval between successive pulses of between said first and second preset periods to prevent said pulses being applied to either the first or second input terminals.

An embodiment of the invention will now be described by way of example with reference to the accompanying drawings, in which.

Figure 1:
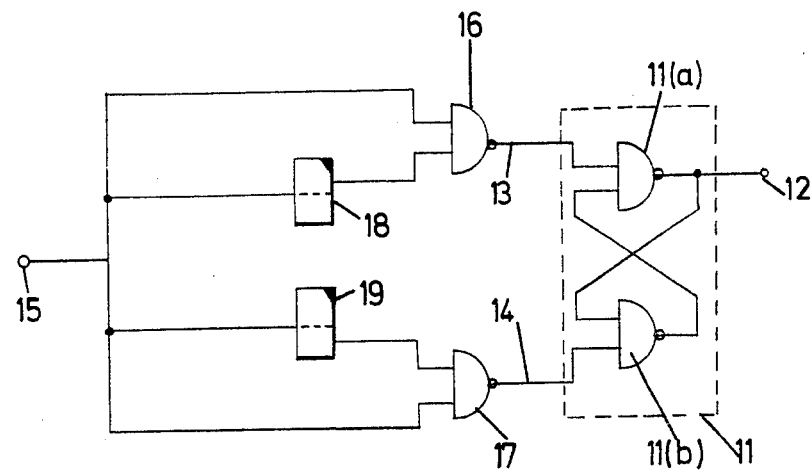
FIG. 1 is a circuit diagram of a pulse-frequency sensitive switching arrangement according to the present invention.

Referring to FIG. 1 the pulse-frequency sensitive switching circuit arrangement has a bistable switching arrangement comprising a bistable circuit element 11, formed from cross-coupled NOR gates 11(a) and 11(b), operable to produce an output signal at an output terminal 12 when latched in a first state and to produce no output signal when latched in a second state. The bistable element is arranged to receive input pulses at a first input along a first line 13 which pulses cause the element to assume its first state and to receive input pulse at a second input along a second line 14 which pulses cause the element to assume its second state.

A circuit input terminal 15 is connected to the lines 13 and 14 by way of gates 16 and 17 respectively. The input terminal is also connected to trigger inputs of monostable circuit elements 18 and 19. An output terminal of the monostable element 18 is connected to an input terminal of the gate 16 and an output terminal of the monostable element 19 is connected to an input terminal of the gate 17. The monostable element 19 and the gate 17 comprise first switching means and the element 18 and the gate 16 comprise second switching means. The monostable element 18 normally produces an output when in a stable state such that the gate 16 is open to pass any pulses from the input terminal 15 to the line 13. The monostable element 18 is triggered into an unstable state by the trailing edge of a pulse applied to the input terminal 15 such that for the duration of the unstable period of the element 18, the output level changes to a lower value and the gate 16 is closed to the passage of pulses to the line 13. At the end of the unstable period the gate is reopened.

Similarly, the monostable element 19 normally produces a low level output such that the gate 17 is closed to the passage of pulses; but when the element 19 is triggered by the trailing edge of an input pulse it enters an unstable state in which a high level output signal is produced to open the gate 19 to the passage of pulses for the duration of the unstable period.

Thus it will be seen that if a pulse is applied to the input terminal 15, the pulse is passed by the open gate 16 to latch the bistable element to its first state but is blocked by the gate 17. At the end of the pulse, the trailing edge triggers both monostable elements such that the gate 16 is closed and the gate 17 is opened. If no further pulse is applied to the input terminal, after a first preset unstable period the monostable element 19 returns to its stable state closing the gate 17, and after a second preset unstable period, longer than the first, the monostable element 18 returns to its stable state, opening the gate 16.

Figure 2:
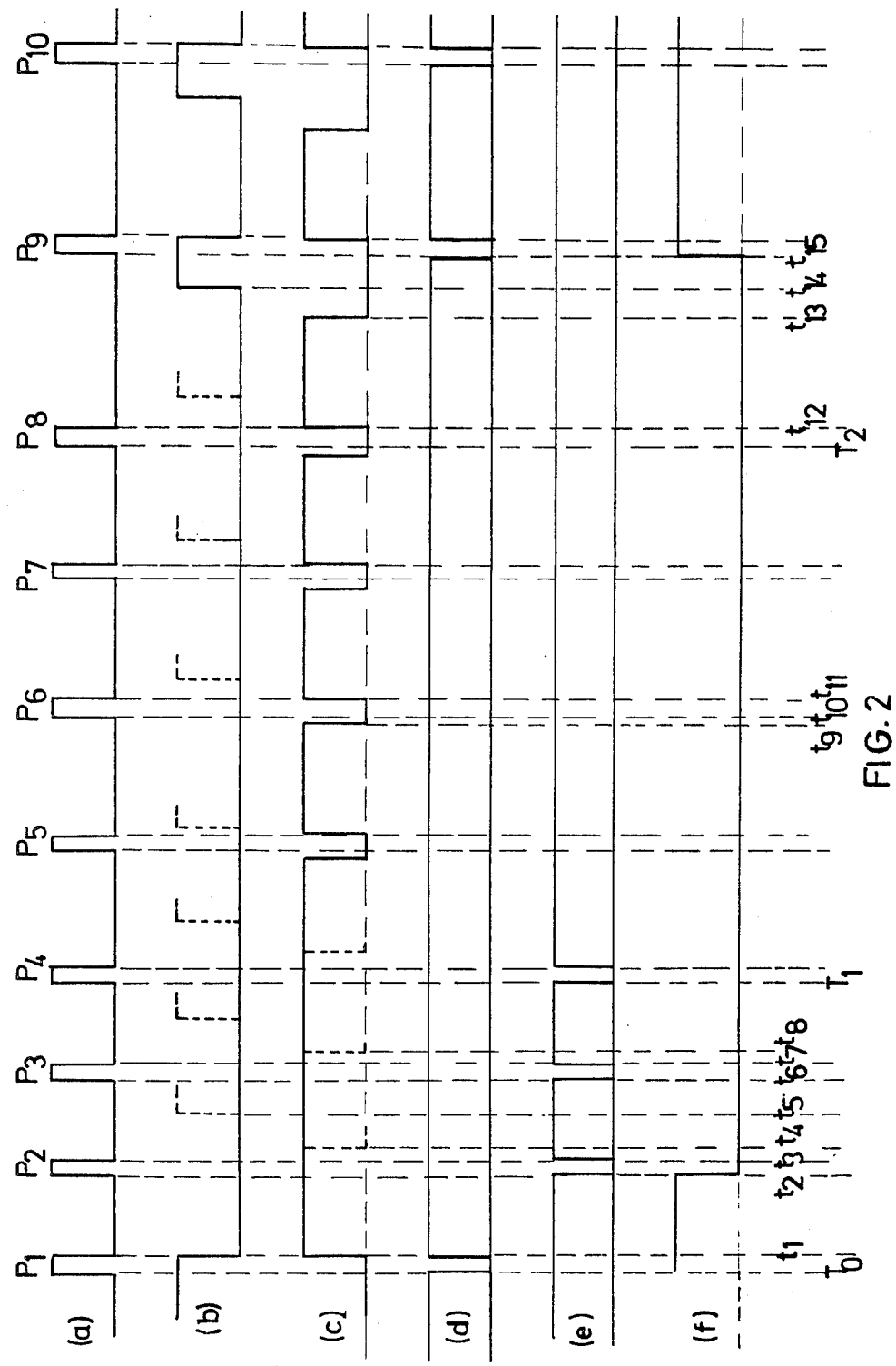
FIG. 2 shows waveforms of signals appearing at various points in the circuit arrangement of FIG. 1.

If the pulse is part of a pulse train then the effect of subsequent pulses depends on whether they appear within the first preset unstable period, after that period but within the second preset unstable period or after both, and each situation will be considered with reference to the waveforms shown in FIG. 2, which waveforms are of the signals at similarly lettered points in the circuit of FIG. 1. The waveform ($a$) comprises that of a trail of pulses applied to the input terminal 15 at a time $I_o$ the pulse repetition frequency of which decreases in two stages at a time $T_1$ and a time $T_2$.

The waveform ($b$) represents the output level of the monostable element 18 and the waveform ($c$) represents the output level of the monostable element 19. The waveforms ($d$) and ($e$) represent the output levels of the gates 16 and 17 respectively and the waveform ($f$) represents the output level of the bistable element 11 and of the circuit arrangement.

Referring to FIGS. 1 and 2, the first pulse P1 begins at the time $T_o$ and extends until a time $t_1$. As described above the gate 16 is normally open and the gate 17 is normally closed so that a pulse (corresponding to the pulse P1 inverted by the gate 16) is applied to the bistable element 11 to latch it into its first state and produce an output level. The trailing edge of the pulse P1 triggers the monostable elements 18 and 19 into their unstable states where they would remain until times $t_5$ and $t_4$ (less than $t_5$) respectively. The second pulse P2 arrives at a time $t_2$, within the unstable periods of both monostable elements. The gate 16 is closed at this time and the gate 17 is open so that the pulse is applied along line 14 to the bistable element 11 to cause it to latch in its second state, wherein no output signal is produced ($f$). The trailing edge of the pulse P2 at a time $t_3$ retriggers the monostable elements to remain in their unstable states until times $t_9$ and $t_8$ instead of returning to their stable states at the aforementioned times $t_5$ and $t_4$.

Thus each subsequent pulse is passed by the gate 17 to keep the bistable element latched in its second state, and is blocked by the gate 16.

After the pulse P4 which occurs at the time $T_1$, both monostable elements are retriggered to their unstable states. The next input pulse, P5, now occurs at a time $t_{10}$ which is after the monostable element 19 has returned to its stable state at a time $t_9$. Thus at the time $t_{10}$, both the gates 16 and 17 are closed and the pulse P5 is blocked. The trailing edge of the pulse P5, at a time $t_{11}$ triggers the monostable element 19 to its unstable state and retriggers the monostable element 18 to remain in its unstable state. By the time the next input pulse P6 arrives, the monostable element 19 has returned to its stable state and both gates 16 and 17 are closed. This situation continues until the time $T_2$ when the period between successive pulses increases to a value greater than the unstable period of the monostable element 18. The monostable element 19 is triggered to its unstable state at a time $t_{12}$ by the trailing edge of the pulse P8 and the element 18 is retriggered to remain in its unstable state. The monostable element 19 returns to its stable state at a time $t_{13}$ and the monostable element 18 returns to its stable state at a later time $t_{14}$, before the next input pulse P9 arrives at a time $t_{15}$. At the time $t_{15}$, the gate 16 is open and the gate 17 closed so that the pulse P9 latches the bistable element 11 in its first state to give a high level output signal. The trailing edge of the pulse P9 triggers both monostable elements to their unstable states but they both return to their stable states before the next pulse P10 is applied. Thus the gate 16 is open and the gate 17 is closed when each input pulse is applied and the bistable element 11 remains latched in its first state.

Thus it will be apparent that if both monostable elements are both in their unstable state when the next input pulse is applied the gate 16 is closed and blocks the pulse whereas the gate 17 is open and passes the pulse, keeping the output of the bistable element at the low level; if the monostable element 18 is in the unstable state but the monostable element 19 is in the stable state then both the gates 16 and 17 are closed and the pulse does not reach the bistable element which remains latched in its previous state; and if both the monostable elements 18 and 19 are in their stable states when the next pulse is applied the gate 16 is open and the pulse is applied to the bistable element to provide a high output level whereas the gate 17 is closed and blocks the pulse.

Thus the output state will change to a high level only when the period between pulses exceeds the (longer) unstable period of the monostable element 18 and will change to a low level only when the period between pulses is less than the (shorter) unstable period of the monostable element 19, so that a hysteresis occurs between the pulse repetition frequencies at which the output state changes.

For a nominal switching frequency of 10 pulses per second the unstable period of the monostable element 18 is set to be between 1/9 and 1/10 second and the unstable period of the element 19 is set to be between 1/10 and 1/11 second, the actual value depending on the duration of the input pulses.

The use of hysteresis prevents unnecessary switching between output levels for slight variations in input pulse frequency about the switching frequency.

The gates 16 and 17 can be AND or NAND gates; the output may be taken from either gate of the bistable element according to whether a high or low level output is required for frequencies have the nominal switching frequency.

The choice of unstable periods for the monostable elements is such that spurious pulses produced in the pulse train by external interference cannot cause the circuit to switch unless they occur almost coincidentially with the pulses of the train, the circuit arrangement being particularly suited to electrically noisy environments where spurious pulses are likely to be introduced into conductors and pulse train generating arrangements.

One use of the frequency sensitive switch described above is with an automatic gear-change arrangement for an automotive gear box. In such automatic operation, gear change is initiated by sensing the road speed and, if engine parameters, loading and the like permit, changing gear when predetermined speeds occur. The road speed may be measured by a tachogenerator attached to the propellor shaft which produces a pulse train having a repetition frequency proportional to the rotational speed of the shaft. Obviously, in the course of driving of the vehicle the rotational speed of the propellor shaft will vary through the gear-change values and will on occasions be maintained at or vary slightly around the gear change values; if gear changing is effected each time that a particular speed is reached then the box will hunt between adjacent gear ratios. A frequency sensitive switching arrangement according to the present invention is used to switch between each adjacent pair of gears, the hysteresis serving to prevent such hunting.

Figure 3:
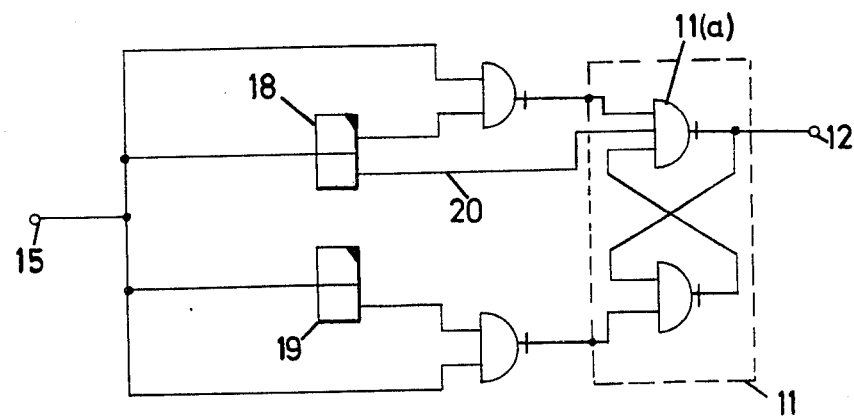
FIG. 3 is a circuit diagram of a modified form of the circuit of FIG. 1.

A modified form of frequency sensitive switching suitable for use with an automotive gear box as described above is shown in FIG. 3. The circuit shown in the Figure corresponds to that of FIG. 1 but with the monostable element 18 provided with an additional output terminal at which an output signal is produced when the element is in its stable state. The additional output terminal is connected by means of a line 20 to the gate 11($a$) of the bistable switching arrangement, that is, effectively to the first input of the arrangement.

When power is first supplied to the circuit arrangement the monostable element 18 and 19 are both in their stable states and the bistable element is reset so as to provide an output signal at the terminal 12. When the first pulse is applied it is passed by the gate 16 to maintain the bistable switching arrangement in its reset state; at the trailing edge of the pulse the bistable elements 18 and 19 are triggered into their unstable states and the reset signal removed from the line 20.

When the interval between successive input pulses is sufficiently short that the monostable element 18 does not return to its stable state before the next pulse the element provides no reset signal and the bistable switching arrangement is not reset.

When the interval between successive input pulses is such that both monostable elements 18 and 19 return to their stable states before the next pulse, the additional output of the monostable element 18 provides a reset signal to the bistable switching arrangement. If a following pulse does occur, then the bistable switching arrangement is in the correct state and the pulse does not change it; if there are no further pulses, then the bistable switching arrangement is correctly placed in the state corresponding to a low input pulse repetition frequency.

If a fault occurs in the transducer which produces the input pulses such that they cease to be produced, then the bistable switching arrangements all assume their low pulse rate states which, subject to engine parameters, causes the gear box to change through each ratio until the lowest, or starting, gear is engaged.

In the absence of this resetting facility the gear box would remain in a high gear when the vehicle is stopped, in which gear the vehicle would be unable to start to produce pulses and hence select a lower, more suitable gear unless a manual gear selection facility were also provided. The resetting facility is also of use if the vehicle to which the system is fitted stops rapidly, for instance in an emergency, while travelling in a high gear. Under such conditions it is possible for the supply of pulses to cease in less time than the gear box requires to select the lower or starting gear. The discontinuity of the pulse supply enables the monostable device 21 to reset the bistable switching arrangement of the, or each, switching arrangement and the starting gear to be automatically selected.

What we claim is:

1. A frequency sensitive switching circuit arrangement comprising a circuit input terminal arranged to receive input pulses from a pulse train, a bistable switching arrangement having first and second input terminals and responsive to the application of an input pulse, by way of the circuit input terminal, to either one of said first or second input terminals to provide an output signal having a first or second level respectively, first switching means responsive to a time interval between successive input pulses of less than a first preset period to apply said pulses to the first input terminal, and second switching means responsive to a time interval between successive input pulses in excess of a second preset period, longer than the first, to apply said pulses to the second input terminal, the first and second switching means being responsive to a time interval between successive pulses of between said first and second preset periods to prevent said pulses being applied to either the first or second input terminals.

2. A frequency sensitive switching circuit arrangement as claimed in claim 1 in which the first switching means comprises a first monostable circuit element connected to the circuit input terminal and arranged to be triggered by an input pulse into an unstable state for said first preset period, and first gating means connected both to the circuit input terminal and to the first monostable circuit element so as to be open to the passage of input pulses when the monostable circuit element is in its unstable state.

3. A frequency sensitive switching circuit arrangement as claimed in claim 1 in which the second switching means comprises a second monostable circuit element connected to the circuit input terminal and arranged to be triggered by an input pulse into an unstable state for said second preset period, and second gating means connected both to the circuit input terminal and to the second monostable circuit element so as to be closed to the passage of input pulses when the monostable circuit element is in its unstable state.

4. A frequency sensitive switching circuit arrangement as claimed in claim 1 in which there is provided resetting means responsive to an interval between successive pulses of at least said second preset period, to cause the bistable switching arrangement to produce an output signal at said first level.

5. A frequency sensitive switching arrangement as claimed in claim 4 in which the resetting means comprises said second switching means adapted to provide a reset signal at the end of said second preset period and connected to supply said reset signal to said first input terminal.

* * * * *